United States Patent [19]

Helbert

[11] 4,233,394

[45] Nov. 11, 1980

[54] METHOD OF PATTERNING A SUBSTRATE

[75] Inventor: John N. Helbert, Eatontown, N.J.

[73] Assignee: The United States of America as represented by the Secretary of the Army, Washington, D.C.

[21] Appl. No.: 51,263

[22] Filed: Jun. 22, 1979

[51] Int. Cl.³ ............................................. B05D 3/06
[52] U.S. Cl. ............................... 430/270; 204/159.22; 430/296; 430/326
[58] Field of Search .................. 427/43; 204/159.22; 260/32.4; 96/35.1, 36.2, 115 R; 430/270, 296, 326

[56] References Cited

U.S. PATENT DOCUMENTS

| | | | |
|---|---|---|---|
| 3,231,552 | 1/1966 | Natta et al. | 260/32.4 |
| 3,253,058 | 5/1966 | Isley et al. | 260/32.4 |
| 3,539,542 | 11/1970 | Nakatsuka et al. | 260/32.4 |
| 3,574,177 | 4/1971 | Nakajima et al. | 260/32.4 |

OTHER PUBLICATIONS

Haller et al., "IBM Journal" vol. 12, May 1968 pp. 251-256.
Ku et al., "J. Electrochem Soc.: Solid State Science" vol. 116 No. 7 Jul. 1969 pp. 980-985.
Helbert et al., "J. Electrochem Soc." vol. 126 No. 4 Apr. 1979 pp. 694-696.

*Primary Examiner*—John H. Newsome
*Attorney, Agent, or Firm*—Nathan Edelberg; Sheldon Kanars; Roy E. Gordon

[57] ABSTRACT

A substrate is patterned by first dissolving polymethacrylonitrile in a spinning solvent that will dissolve the polymer and form a viscous solution. The solution is then applied to the surface of the substrate and the substrate spun to form a smooth, uniform resist film of at least 3000 angstroms in thickness. The resist film is heated and the region of the resist film to be patterned is then exposed to ionizing radiation until the dissolution rate of the irradiated region of the resist film is greater than five times the dissolution rate of the unirradiated region of the resist film. The exposed regions of the resist film are then developed to the substrate in a mixture of acetonitrile or benzonitrile and toluene.

4 Claims, No Drawings

METHOD OF PATTERNING A SUBSTRATE

The invention described herein may be manufactured, used, and licensed by or for the Government for governmental purposes without the payment to me of any royalty thereon.

This invention relates in general to a method of patterning a substrate and in particular, to a method of patterning a desired circuit pattern on a circuit substrate.

BACKGROUND OF THE INVENTION

Electron-beam lithography (EBL) is an integrated circuit production technique which utilizes a polymer resist to delineate circuit patterns for monolithic circuits. Where the e-beam is impinged upon the resist coated circuit substrate, the e-beam resist either degrades or crosslinks depending upon the intrinsic nature of the resist. If the polymer degrades, it is a positive acting e-beam resist. If it crosslinks, it is a negative acting resist. By using the e-beam resist it is possible to pattern the desired circuit pattern upon the circuit substrate as for example, a silicon wafer with an oxide top layer.

Poly(methyl methacrylate)

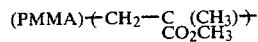

is the state-of-the-art positive e-beam resist material. It is capable of high resolution but is not sensitive enough for commercial device production using direct-write e-beam lithography. The e-beam sensitivity of PMMA is $1.1 \times 10^{-4}$ Coulombs per cm$^2$, while sensitivities in the $10^{-5}$–$10^{-6}$ range are desirable for EBL production; resolution, however, cannot be sacrificed for sensitivity. Resolution is stipulated by the minimum obtainable linewidth and line space for the resist. In this connection, PMMA is capable of resolving 1 micron lines and spaces.

SUMMARY OF THE INVENTION

The general object of this invention is to provide a method of patterning a substrate. A more specific object is to provide such a method for patterning a desired circuit pattern on a circuit substrate. A further object of the invention is to provide such a method utilizing (EBL) with a positive acting e-beam resist. A still further object of the invention is to provide such a method in which the positive acting e-beam resist is characterized by increased sensitivity without a sacrifice in resolution.

The foregoing objects have now been attained by (EBL) using poly(methacrylonitrile)

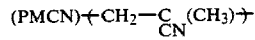

as a positive action e-beam resist. More particularly, according to the invention, (PMCN) is first dissolved in a spinning solvent that will dissolve the polymer and form a viscous solution. The solution is then applied to the surface of the substrate and the substrate spun to form a smooth, uniform resist film of at least 3000 angstroms in thickness. The resist film is heated and the region of the resist film to be patterned then exposed to ionizing radiation until the dissolution rate of the irradiated region of the resist film is greater than 5 times the dissolution rate of the unirradiated region of the resist film. The exposed regions of the resist are then developed to the substrate.

DESCRIPTION OF THE PREFERRED EMBODIMENT 0.30 gram of PMCN powder is dissolved in 9 cc of nitromethane to form a viscous solution. The solution is filtered through an 0.6 to 1 micron filter and the filtrate applied to a silicon wafer having an oxide surface layer of 1250 angstroms in thickness. The substrate is spun by conventional spinning techniques to obtain a film of about 6000 angstroms in thickness. After spinning the resist film is heated at about 130 degrees C. for greater than 1 hour. The resist film above the region of the substrate to be patterned is then exposed to 10 keV electrons until exposures greater than 1 to $2 \times 10^{-5}$ Coulombs per cm$^2$ have been made. The exposed regions of the resist film are then developed to the substrate in a 4 to 1 mixture of benzonitrile and toluene. The resulting patterned silicon wafer is characterized by higher e-beam sensitivity as well as state of the art resolution.

The PMCN powder used in the invention can be conveniently obtained by fractionation from a 4% acetonitrile soluton utilizing methanol as nonsolvent. The resulting fractions have numberaveraged ($\overline{M}n$) molecular weights varying from 140,000 to 500,000 as determined by membrane osmometry in acetonitrile solvent.

The spinning solvent for the PMCN must dissolve a high enough concentration of PMCN to result in a viscous solution that can be applied as a smooth uniform resist film of at least 3,000 angstroms in thickness. The use of nitromethane as the spinning solvent is preferred. Films ranging from 5000 angstroms to 10,000 angstroms can be cast using 2 to 25 percent solutions of PMCN in nitromethane. A particularly desirable range of spinning frequencies is 2000 to 3500 rpm. As the substrate, one can use any material on which circuit patterns are delineated. Substrate materials that can be used include silicon wafers with 1000 to 2000 angstroms of conventional grown oxide, or chrome coated glass.

After the resist film has been applied to the substrate, the resist film may be heated to improve the adhesion of the resist to the substrate. The region of the resist film to be patterned is then exposed to ionizing radiation until the dissolution rate of the irradiated region of the resist film is greater than 5 times the dissolution rate of the unirradiated region of the resist film. The ionizing radiation may be electron beam or x-ray.

After the irradiation, the exposed region of the resist is developed to the substrate. In this connection, the most critical item in developing a resist process for e-beam lithography is the resist developer. Even if good images are exposed into the resist, a poor developer can seriously degrade the resolution performance of the resist beyond the toleration limits. An acetonitrile based developer of a mixture of 3 parts acetonitrile to 4 parts toluene and benzonitrile based developer of a mixture of 4 parts benzonitrile to 1 part toluene yielded usable images. Of these, the use of the benzonitrile based developer is preferred. This developer formulation allows lines with exposed doses of $5 \times 10^{-5}$ to $1 \times 10^{-5}$ C/cm$^2$ to be developed in 60 seconds in a stationary developer tank filled with 4:1 benzonitrile/toluene developer.

Employing this developer, 1 micron lines with micron edge to edge spaces can be developed in PMCN. The resolution capability of PMCN approaches that of PMMA.

Resist sensitivity is important for commercial utilization because resist writing time may govern circuit production costs. A more sensitive resist requires less writing time, hence, it can determine production costs if the e-beam machine is resistspeed limited. The e-beam sensitivity of PMCN is between 1.5 and $1.6 \times 10^{-5}$ C/cm². The development criterion is 0% unirradiated film thickness loss during development. The sensitivity results are normalized to a film thickness of 6800 A. The PMCN sensitivities reported above are approximately a factor 4-5 more sensitive than PMMA, and represent a significant improvement over PMMA with little if any difference in resolution capability.

It should also be pointed out that PMCN plasma etches by a factor of 3 times slower than PMMA. Therefore, PMCN is characterized by superior plasma etch compatibility as compared to PMMA.

Moreover, PMCN resist withstands the buffered-HF treatments that are often encountered in oxide patterning processes.

I wish it to be understood that I do not desire to be limited to the exact details of construction as described for obvious modifications will occur to a person skilled in the art.

What is claimed is:

1. Method of patterning a substrate, said method including the steps of:
   (A) dissolving polymethacrylonitrile in a spinning solvent that will dissolve the polymer and form a viscous solution,
   (B) applying the solution to the surface of the substrate to form a smooth, uniform resist film of at least 3,000 angstroms in thickess,
   (C) heating the resist film,
   (D) exposing the region of the resist film to be patterned to ionizing radiation until the dissolution rate of the irradiated region of the resist film is greater than 5 times the dissolution rate of the unirradiated region of the resist film, and
   (E) developing the exposed regions of the resist to the substrate in a developer selected from the group consisting of a 3 to 4 mixture of acetonitrile and toluene.

2. Method of patterning a substrate, said method including the steps of:
   (A) dissolving polymethacrylonitrile in a spinning solvent that will dissolve the polymer and form a viscous solution,
   (B) applying the solution to the surface of the substrate and spinning the substrate to form a smooth, uniform resist film of at least 3,000 angstroms in thickness,
   (C) heating the resist film,
   (D) exposing the regions of the resist film to be patterned to ionizing radiation until the dissolution rate of the irradiated region of the resist film is greater than 5 times the dissolution rate of the unirradiated region of the resist film, and
   (E) developing the exposed regions of the resist to the substrate in a 3 to 4 mixture of acetonitrile and toluene.

3. Method of patterning a substrate, said method including the steps of:
   (A) dissolving polymethacrylonitrile in a spinning solvent that will dissolve the polymer and form a viscous solution,
   (B) applying the solution to the surface of the substrate and spinning the substrate to form a smooth, uniform resist film of at least 3,000 angstroms in thickness,
   (C) heating the resist film,
   (D) exposing the region of the resist film to be patterned to ionizing radiation until the dissolution rate of the irradiated region of the resist film is greater than 5 times the dissolution rate of the unirradiated region of the resist film, and
   (E) developing the exposed regions of the resist to the substrate in a 4 to 1 mixture of benzonitrile and toluene.

4. Method of patterning a desired circuit pattern on a silicon wafer having an oxide surface layer of about 1250 angstroms in thickness, said method consisting of:
   (A) dissolving about 0.30 gram of polymethacrylonitrile powder in about 9 cc of nitromethane, and filtering the solution through a 0.6 to 1 micron filter,
   (B) applying the filtrate from step (A) to the oxide surface layer on the silicon wafer and spinning the silicon wafer to form a smooth, uniform resist film of about 6000 angstroms in thickness,
   (C) heating the resist film at about 130 degrees C. for greater than 1 hour,
   (D) exposing the region of the resist film to be patterned to 10 keV electrons until exposures greater than 1 to $2 \times 10^{-5}$ Coulombs/cm² have been made, and
   (E) developing the exposed regions of the resist film to the silicon oxide surface layer in a 4 to 1 mixture of benzonitrile and toluene.

* * * * *